US012696435B2

(12) United States Patent
Buchling Rego et al.

(10) Patent No.: US 12,696,435 B2
(45) Date of Patent: Jul. 28, 2026

(54) DATA-ANALYSIS-BASED FEEDBACK OF COMPONENT POSITIONING WITHIN AN ELECTRONIC ASSEMBLY

(71) Applicant: INTERNATIONAL BUSINESS MACHINES CORPORATION, Armonk, NY (US)

(72) Inventors: Philipp K. Buchling Rego, Wappingers Falls, NY (US); Levi Campbell, Poughkeepsie, NY (US); Francis R. Krug, Jr., Highland, NY (US); Milnes P. David, New Paltz, NY (US); Allan Cory VanDeventer, Poughkeepsie, NY (US); Yuanchen Hu, Peekskill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 400 days.

(21) Appl. No.: 18/341,046

(22) Filed: Jun. 26, 2023

(65) Prior Publication Data
US 2024/0431086 A1 Dec. 26, 2024

(51) Int. Cl.
*H05K 13/08* (2006.01)
*G06F 1/185* (2026.01)
*H05K 7/20* (2006.01)

(52) U.S. Cl.
CPC ........... *H05K 13/082* (2018.08); *G06F 1/185* (2013.01); *H05K 7/2039* (2013.01)

(58) Field of Classification Search
CPC .. H05K 13/082; H05K 7/2039; H05K 7/1498; H05K 7/20272; H05K 7/20772;
(Continued)

(56) References Cited

U.S. PATENT DOCUMENTS 7,527,532 B2 5/2009 Northey
7,989,229 B2 8/2011 Covell
(Continued)

FOREIGN PATENT DOCUMENTS

| CN | 202730549 U | 2/2013 |
| DE | 102019112423 A1 | 11/2020 |
| DE | 102018210506 B4 | 7/2022 |

OTHER PUBLICATIONS

Thistle, et al., Validating an Uncoupled Laser-Aiming Device For Serial Implant Radiography, Retrieved from: https://pubmed.ncbi.nlm.nih.gov/9477857/, 1997, 2 pages.

*Primary Examiner* — Eric J Yoon
(74) *Attorney, Agent, or Firm* — Eric Chesley, Esq.; Kevin P. Radigan, Esq.; Heslin Rothenberg Farley & Mesiti P.C.

(57) ABSTRACT

Component positioning feedback within an electronic assembly is provided. The feedback process includes obtaining component position data from a plurality of sensors of the electronic assembly. The component position data facilitates in situ evaluation of positioning of the component within the electronic assembly. Further, the process includes determining, by data analysis of the component position data, a current positioning of the component of the electronic assembly relative to another component of the electronic assembly, and generating a position feedback signal based on the determined current positioning of the component of the electronic assembly relative to the other component of the electronic assembly.

20 Claims, 15 Drawing Sheets

500

(58) Field of Classification Search
CPC .. H05K 2201/066; H05K 1/0204; H05K 3/30; H05K 7/204; G06F 1/185; G06F 1/20; G06F 1/206; G01R 1/0483; G01R 1/06794; G01R 31/2891
See application file for complete search history.

(56) References Cited

U.S. PATENT DOCUMENTS

| | | | |
|---|---|---|---|
| 8,672,688 B2 | 3/2014 | Florence, Jr. et al. | |
| 8,710,858 B2 | 4/2014 | Detofsky et al. | |
| 9,743,558 B2 | 8/2017 | Bosak et al. | |
| 10,605,622 B2 | 3/2020 | Tatenuma | |
| 10,809,096 B2 | 10/2020 | Bussan | |
| 10,847,937 B2 | 11/2020 | Cartier, Jr. et al. | |
| 11,567,119 B2 | 1/2023 | Kabbani et al. | |
| 2003/0128518 A1* | 7/2003 | Gaynes | H01L 23/3675 257/713 |
| 2009/0210190 A1* | 8/2009 | Carlson | G01K 3/005 702/130 |
| 2012/0280374 A1* | 11/2012 | Choi | H01L 23/34 257/659 |
| 2013/0333207 A1* | 12/2013 | Lee | H05K 3/305 29/739 |
| 2018/0045759 A1* | 2/2018 | Prabhugoud | G01R 1/06794 |
| 2022/0157633 A1* | 5/2022 | Kajinami | H10P 72/0431 |

* cited by examiner

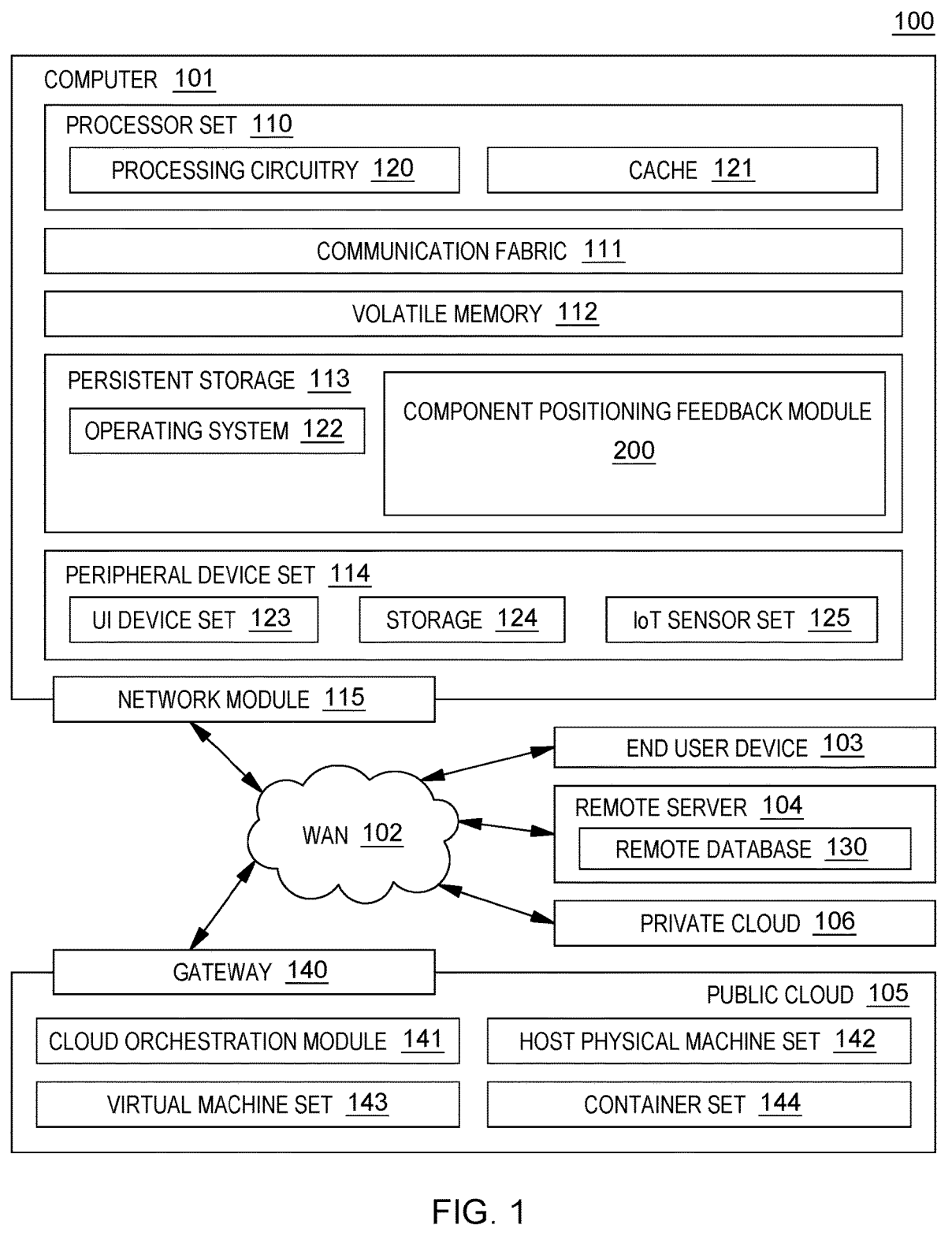

100

COMPUTER 101

PROCESSOR SET 110

PROCESSING CIRCUITRY 120     CACHE 121

COMMUNICATION FABRIC 111

VOLATILE MEMORY 112

PERSISTENT STORAGE 113

OPERATING SYSTEM 122     COMPONENT POSITIONING FEEDBACK MODULE 200

PERIPHERAL DEVICE SET 114

UI DEVICE SET 123     STORAGE 124     IoT SENSOR SET 125

NETWORK MODULE 115

END USER DEVICE 103

REMOTE SERVER 104

REMOTE DATABASE 130

WAN 102

PRIVATE CLOUD 106

GATEWAY 140

PUBLIC CLOUD 105

CLOUD ORCHESTRATION MODULE 141     HOST PHYSICAL MACHINE SET 142

VIRTUAL MACHINE SET 143     CONTAINER SET 144

FIG. 1

DATA-ANALYSIS-BASED FEEDBACK OF COMPONENT POSITIONING WITHIN AN ELECTRONIC ASSEMBLY

BACKGROUND

One or more aspects relate, in general, to providing feedback on component positioning within an electronic assembly.

Electronic assemblies are fabricated in a variety of configurations, including three-dimensional circuit board assemblies and associated heat sink cooling structures. As is well understood, operating electronic components produce heat, which needs to be removed in an effective manner in order to maintain device junction temperatures within desirable limits, with failure to do so resulting in excessive component temperatures, potentially leading to thermal runaway conditions. Several trends in the electronic industry have combined to emphasize the importance of thermal management, including in technologies where thermal management has traditionally been less of a concern. For instance, the need for faster and more densely packed circuits has had a direct impact on the importance of thermal management. Power dissipation, and therefore heat production, increases as device operating frequency is increased. Also, increased operating frequencies are possible at lower device junction temperatures. Further, as more and more circuits are packed onto a single chip, or multichip module, heat flux (Watts/cm$^2$) increases, resulting in the need to dissipate more power from a given sized chip, module or assembly. A variety of heat sinks are used in the electronics industry to facilitate thermal management of an electronic assembly, including air-cooled heat sinks and liquid-cooled heat sinks.

SUMMARY

Certain shortcomings of the prior art are overcome, and additional advantages are provided herein through the provision of a computer-implemented method of providing component positioning feedback for an electronic assembly. The computer-implemented method includes obtaining component position data from a plurality of sensors of the electronic assembly, where the component position data facilitates in situ evaluation of positioning of the component within the electronic assembly. The computer-implemented method further includes determining, via data analysis of the component position data, a current positioning of the component of the electronic assembly relative to another component of the electronic assembly, and generating a position feedback signal based on the determined current positioning of the component of the electronic assembly relative to the other component of the electronic assembly.

Computer systems and computer program products relating to one or more aspects are also described and claimed herein. Further, services relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIG. 1 depicts one example of a computing environment to include and/or use one or more aspects of the present disclosure;

DETAILED DESCRIPTION

Figure 2:
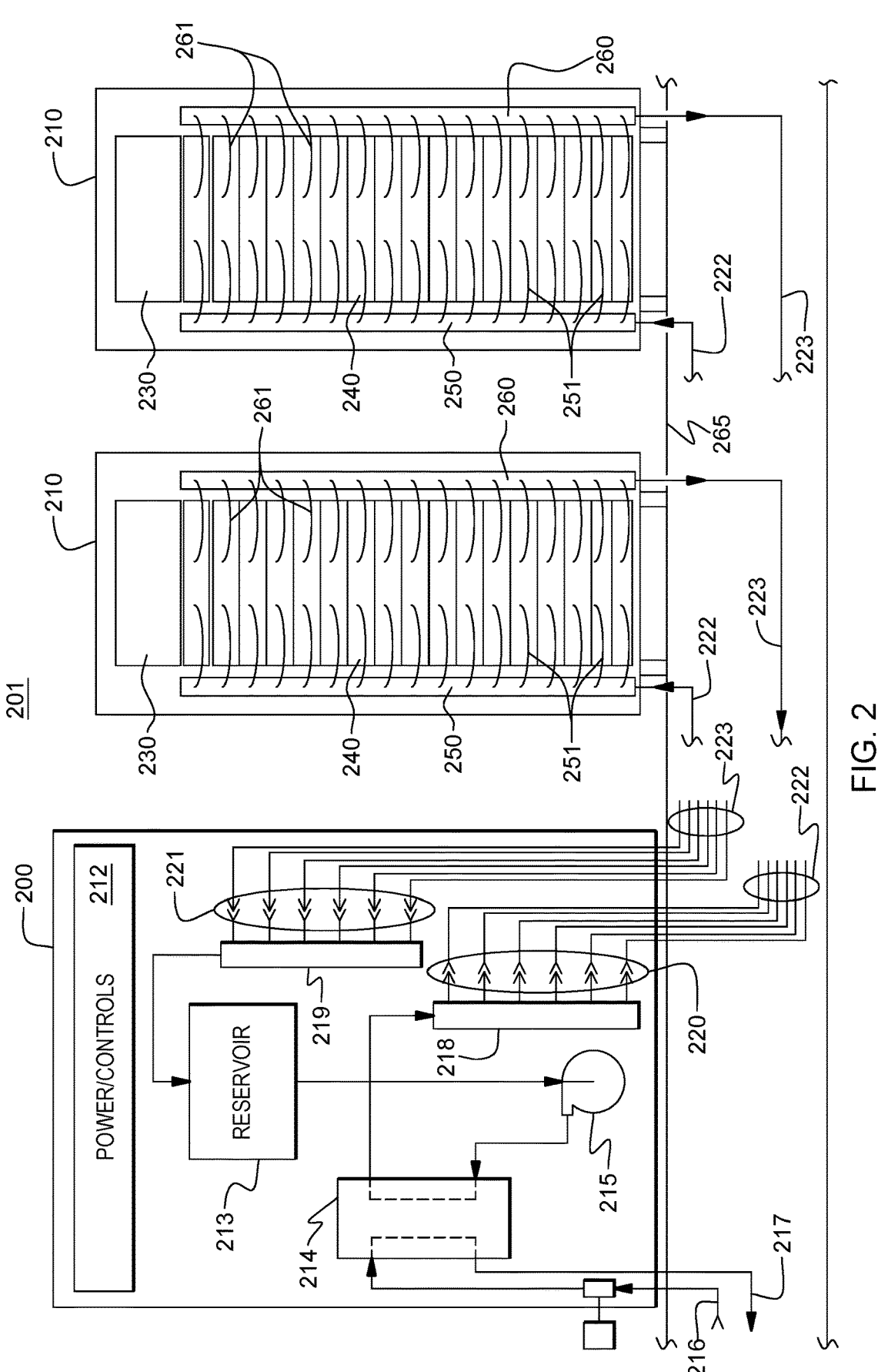
FIG. 2 depicts one embodiment of a data center with a coolant distribution unit facilitating liquid-cooling of electronic assemblies within racks of the data center.

The accompanying figures, which are incorporated in and form a part of this specification, further illustrate the present disclosure and, together with this detailed description, serve to explain aspects of the present disclosure. Note in this regard that descriptions of well-known systems, devices, electronic assemblies, processing techniques, etc., are omitted so as to not unnecessarily obscure the disclosure. It should be understood, however, that the detailed description and the specific example(s), while indicating aspects of the disclosure, are given by way of illustration only, and not limitation. Various substitutions, modifications, additions, and/or other arrangements, within the spirit or scope of the underlying disclosed concepts will be apparent to those skilled in the art from this disclosure. Note further that numerous aspects or features are disclosed herein, and unless inconsistent, each disclosed aspect or feature is combinable with any other disclosed aspect or feature as desired for a particular application of the concepts disclosed.

Note also that certain aspects of illustrative embodiments are described below using specific code, designs, architectures, protocols, layouts, schematics, or tools only as examples, and not by way of limitation. Furthermore, the illustrative embodiments are described in certain instances using particular software, hardware, tools, or data processing environments only as example for clarity of description. The illustrative embodiments can be used in conjunction with other comparable or similarly purposed structures, systems, applications, or architectures. One or more aspects of an illustrative embodiment can be implemented in software, hardware, or a combination thereof.

As understood by one skilled in the art, program code, as referred to in this application, can include software and/or hardware. For example, program code in certain embodiments of the present disclosure can utilize a software-based implementation of the functions described, while other embodiments can include fixed function hardware. Certain embodiments combine both types of program code. Examples of program code, also referred to as one or more programs, are depicted in FIG. 1, including operating system 122 and component positioning feedback module 200, which are stored in persistent storage 113.

One or more aspects of the present disclosure are incorporated in, performed and/or used by a computing environment. As examples, the computing environment can be of various architectures and of various types, including, but not limited to: personal computing, client-server, distributed, virtual, emulated, partitioned, non-partitioned, cloud-based, quantum, grid, time-sharing, clustered, peer-to-peer, mobile, having one node or multiple nodes, having one processor or multiple processors, and/or any other type of environment and/or configuration, etc., that is capable of executing a process (or multiple processes) that, e.g., perform component positioning feedback processing, such as disclosed herein. Aspects of the present disclosure are not limited to a particular architecture or environment.

Prior to describing detailed embodiments of the present disclosure, an example of a computing environment to include and/or use one or more aspects of the present disclosure is discussed below with reference to FIG. 1.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as component positioning feedback module block 200. In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

Computer 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/ or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

Processor set 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

Communication fabric 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

Persistent storage 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface type operating systems that employ a kernel. The code included in block 126 typically includes at least some of the computer code involved in performing the inventive methods.

Peripheral device set 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

Network module 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End User Device (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

Remote server 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

Public cloud 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

The computing environment described above is only one example of a computing environment to incorporate, perform and/or use one or more aspects of the present disclosure. Other examples are possible. Further, in one or more embodiments, one or more of the components/modules of FIG. 1 need not be included in the computing environment and/or are not used for one or more aspects of the present disclosure. Further, in one or more embodiments, additional and/or other components/modules can be used. Other variations are possible.

Generally, an electronics assembly (or electronic assembly) can contain a number of components, such as circuit boards, electronic components, cooling components, sockets, etc., assembled together. The electronic components can include circuit elements, discrete components, integrated circuits, semiconductor die, modules, etc. Enhanced performance can be obtained by densely packing circuits within the electronic assembly, often resulting in three-dimensional circuit assemblies on one or more circuit boards (or laminates), such as one or more printed circuit boards. Due to complexities of many electronic assemblies, component connection defects may not immediately be noticed until a catastrophic failure happens, preventing operation or shortening life of the electronic assembly. For instance, once an electronic circuit subassembly (such as a processor module or integrated circuit die assembly) has been fully engaged in a mounting socket to a printed circuit board, and a heat sink has been coupled to the subassembly, it is difficult to examine or determined whether the components are all properly positioned relative to each other within the electronic assembly. For example, it can be difficult during assembly to ensure proper landing and coplanarity between, for instance, a heat sink, a module, a socket and a main circuit board.

Prior to describing detailed embodiments of a component positioning feedback facility, module and process in accordance with one or more aspects of the present disclosure, an example of a liquid-cooled heat sink (i.e., a cold plate module) is described below with reference to FIGS. 2-4. Those skilled in the art will note, however, that this liquid-cooled heat sink implementation is one example only of a heat sink that can be provided to cool one or more components of an electronic assembly, such as an electronic circuit subassembly (e.g., a semiconductor die subassembly) of the electronic assembly. In one or more other embodiments, an air-cooled heat sink can be employed in place of a liquid-cooled heat sink. Many heat sink variations are possible for inclusion within an electronic assembly such as described herein. Note also that, in one or more embodiments, the component positioning feedback processing disclosed can be used in an electronic assembly without a heat sink, or separate from the heat sink, for instance, to ascertain or confirm positioning of one component of the electronic assembly relative to another component of the electronic assembly, such as to confirm positioning of a subassembly circuit board within a socket mounted to a main circuit board of the electronic assembly.

One or more electronic circuits or modules can be an exemplary component of, for instance, an electronics assembly requiring cooling. By way of example, an electronic circuit can include one or more integrated circuit die (or chips), and/or other electronic devices to be cooled, including one or more processor chips, such as central processing unit (CPU) chips and/or graphics processing unit (GPU) devices. Further, the term coolant-cooled heat sink or cold plate is used herein to refer to a thermally-conductive structure or assembly having one or more internal compartments, channels, passageways, etc., formed therein for flowing of coolant therethrough. One example of coolant that can be used within a coolant-cooled heat sink discussed herein is water. However, the concepts disclosed herein can be used with heat sinks employing other types of coolant, as well as to other types of heat sinks.

Figure 3A:
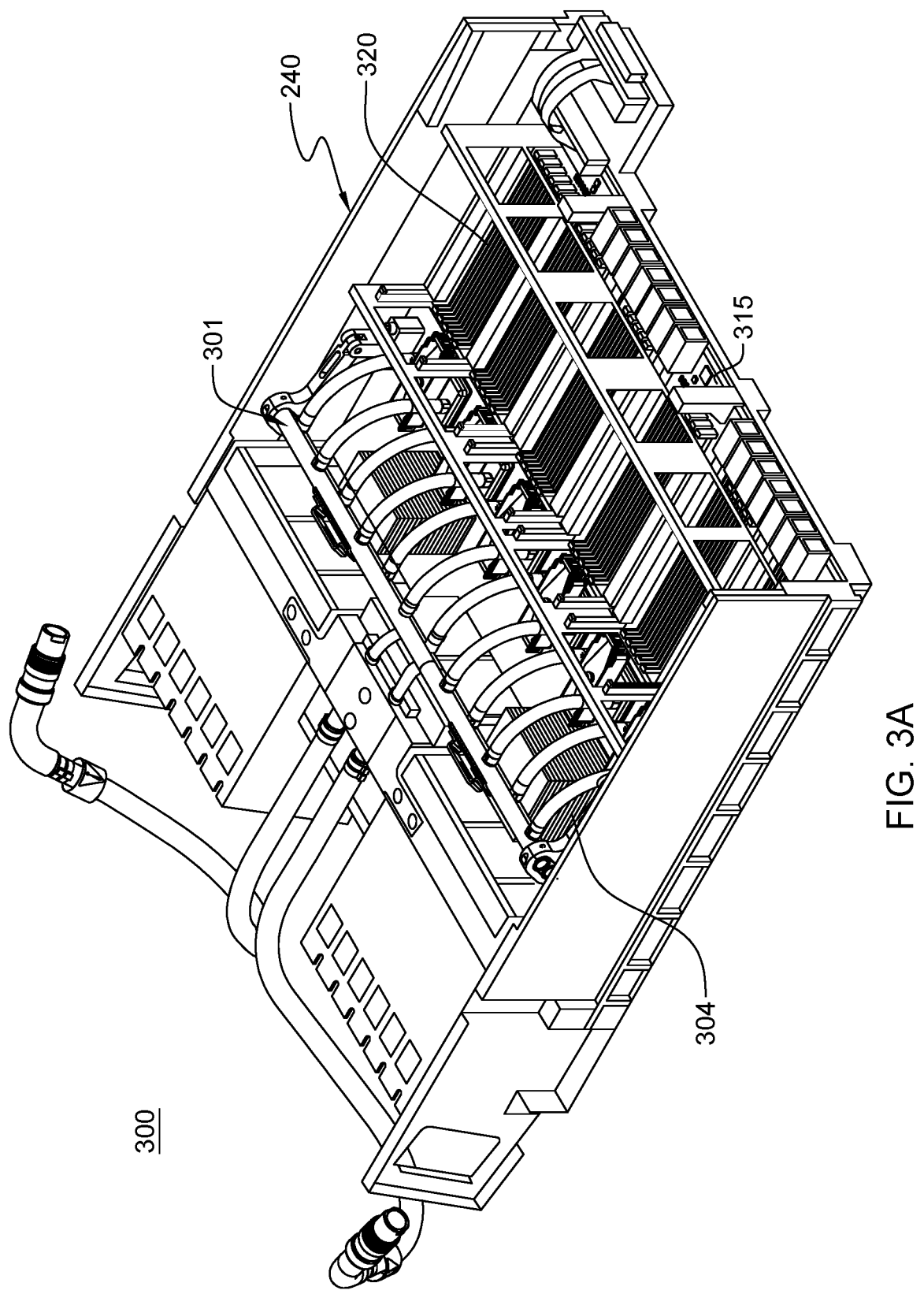
FIGS. 3A-3B depict one embodiment of an electronic assembly within a partially assembled electronic system, which is to incorporate in situ evaluation of positioning of one or more components of the electronic assembly, in accordance with one or more aspects of the present disclosure.
Figure 3B:
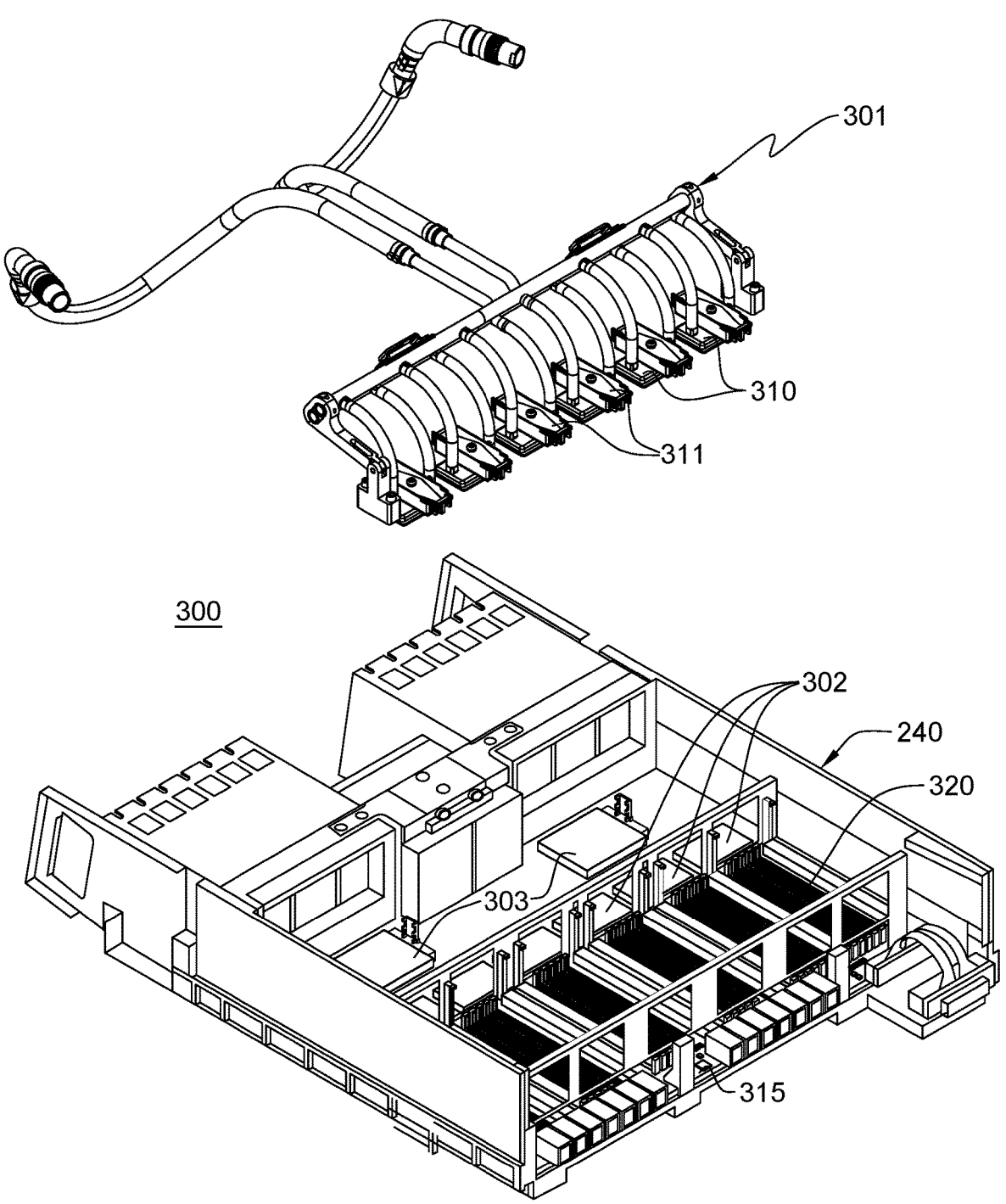
Figure 4:
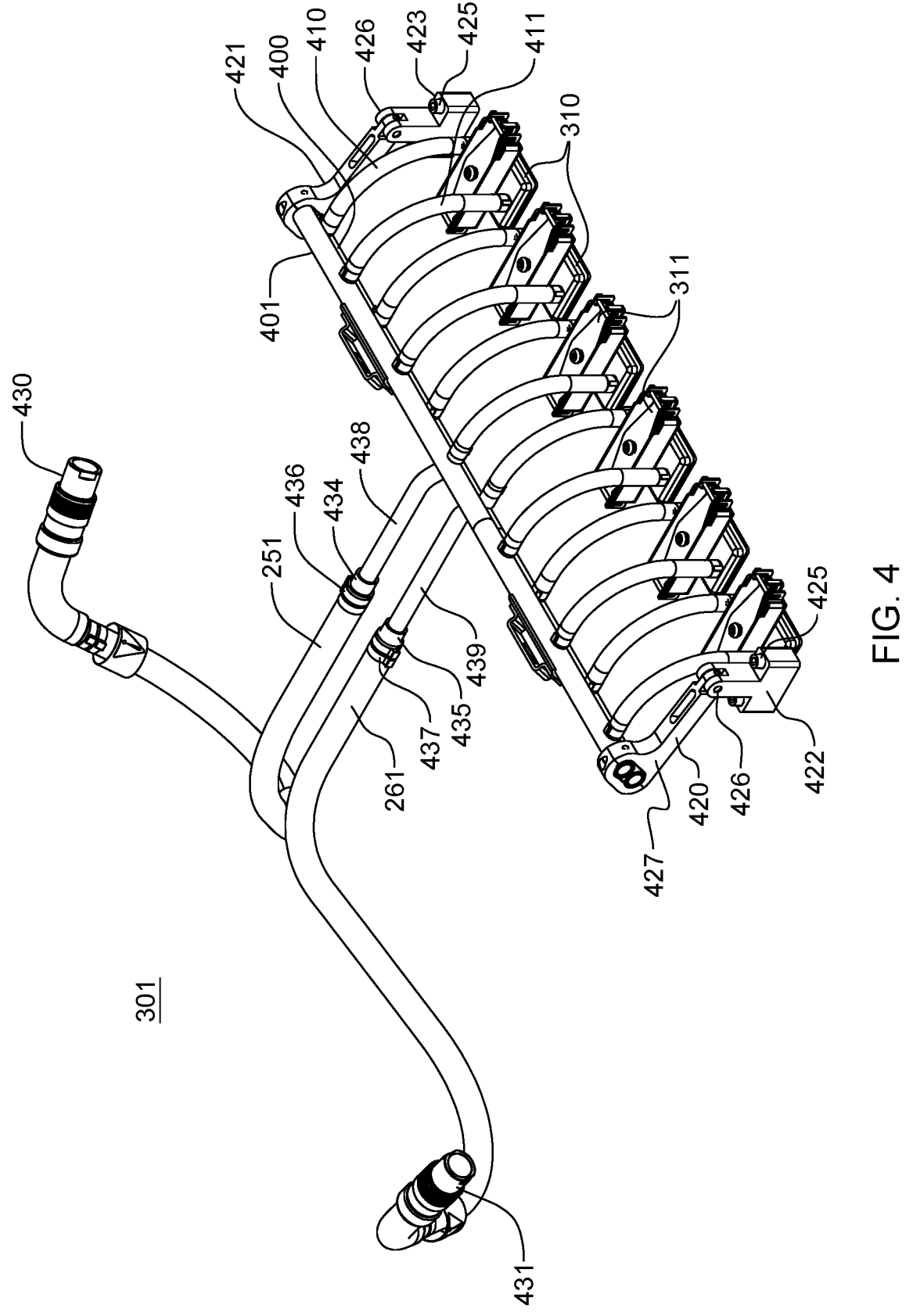
FIG. 4 is an enlarged view of one embodiment of the liquid-cooled heat sink assembly of the electronic assembly of FIGS. 3A-3B.

By way of background only, FIGS. 2-4 illustrate one embodiment of a data center and electronics system employing a liquid-based cooling system with one or more coolant-cooled heat sinks or cold plates coupled to high-heat-generating electronic components disposed within one or more electronic systems of one or more electronics racks.

In particular, FIG. 2 depicts one embodiment of a data center 201 including a coolant distribution unit 200. The coolant distribution unit can be a relatively large unit which occupies what would be considered a full electronics frame. Within coolant distribution unit 200 is a power/control element 212, a reservoir/expansion tank 213, a heat exchanger 214, a pump 215 (possibly accompanied by a redundant second pump), facility water inlet 216 and outlet 217 supply pipes, a supply manifold 218 supplying water or system coolant to the electronics racks 210 via couplings 220 and lines 222, and a return manifold 219 receiving water from the electronics racks 210, via lines 223 and couplings 221. Each electronics rack includes (in one example) a power/control unit 230 for the electronics rack, multiple electronic systems 240, a system coolant supply manifold 250, and a system coolant return manifold 260. By way of example only, electronics racks 210 are disposed on a raised floor 265 of data center 201, with lines 222 providing system coolant to system coolant supply manifolds 250 and lines 223 facilitating return of system coolant from system coolant return manifolds 260 being disposed beneath the raised floor.

In one embodiment, system coolant supply manifold 250 provides system coolant to the cooling assemblies of the electronic systems (including to coolant-cooled heat sinks thereof) via flexible hose connections 251, which are disposed between the supply manifold and the respective electronic systems within the rack. Similarly, system coolant return manifold 260 is coupled to the electronic systems via flexible hose connections 261. Quick connect couplings can be employed at the interface between flexible hoses 251, 261 and the individual electronic systems.

FIGS. 3A & 3B depict one embodiment of a cooled electronic system 300 or electronic assembly which can incorporate component positioning feedback processing, in accordance with one or more aspects of the present disclosure. By way of example, cooled electronic system 300 includes electronic system 240, such as the above-described drawer- or node-level electronic system of FIG. 2, and a flexible coolant manifold-heat sink assembly 301 coupled thereto. In this implementation, flexible coolant manifold-heat sink assembly 301 is a drawer- or node-level cooling assembly with multiple coolant-cooled heat sinks 310, each configured and sized to attach to and cool a respective electronic component 302, such as a respective high-heat-generating electronic component of a server node. In one example, respective loading brackets 311 can be provided to facilitate secure attachment and loading of coolant-cooled heat sinks 310 to electronic components 302 to ensure good thermal conduction from electronic components 302 to coolant-cooled heat sinks 310.

As one detailed example, the exemplary electronic system of FIGS. 3A & 3B can be an electronics drawer or planar server assembly, which includes a multilayer printed circuit board to which memory sockets and various electronic components to be cooled are attached, both physically and electrically. As illustrated, electronic system 240 can include a support substrate or main circuit board 315, a plurality of memory module sockets 320 (e.g., dual in-line memory module sockets), as well as high-heat-generating processor modules 302, and other components 303, such as memory support modules, which produce less heat and can be air-cooled.

By way of example only, in one or more implementations, one or more other components 303 of electronic system 240 can be air-cooled by an airflow established using one or more air-moving devices (not shown) within electronic system 240, or the electronics rack housing the system. As illustrated, the one or more other components 303 to be air-cooled may have one or more air-cooled heat sinks 304 (FIG. 3A) physically coupled thereto. Note that in the particular embodiment depicted, flexible coolant manifold-heat sink assembly 301 includes a pivotable coolant supply manifold and pivotable coolant return manifold disposed in a first, operational position in FIG. 3A, laterally offset from the row of coolant-cooled heat sinks 310, but overlying the one or more other components 303 of electronic system 140, such as one or more single-chip modules to which air-cooled heat sinks 304 are coupled.

FIG. 4 depicts an enlarged view of one embodiment of flexible coolant manifold-heat sink assembly 301. Note that this implementation of cooling assembly 301 is a drawer- or node-level implementation designed to reside within an electronic system chassis of, for instance, one or more electronic system chassis within an electronics rack, and is discussed herein by way of example only. As illustrated, in addition to multiple coolant-cooled heat sinks 310, flexible coolant manifold-heat sink assembly 301 includes a pivotable coolant supply manifold 400 and a pivotable coolant return manifold 401, which are coupled in this embodiment at opposite ends to a first pivot arm 420 and a second pivot arm 421. Flexible coolant supply conduits 410 and flexible coolant return conduits 411 couple, in the illustrated example, each coolant-cooled heat sink 310 in fluid communication with pivotable coolant supply manifold 400 and pivotable coolant return manifold 401 to allow for flow of coolant, such as liquid coolant, through the heat sinks to facilitate extraction of heat generated by the associated electronic components to which the heat sinks are coupled.

Note that, by way of example, each coolant-cooled heat sink 310 has a flexible coolant supply conduit 410 and a flexible coolant return conduit 411 coupled thereto for direct supply and return of coolant through the coolant-cooled heat sink. Thus, in the illustrated embodiment, coolant, such as liquid coolant, flows in parallel through the heat sinks between the pivotable coolant supply manifold 400 and pivotable coolant return manifold 401.

As noted, respective loading brackets 311 can be provided to facilitate (in part) a good thermal interface and good thermal conduction between coolant-cooled heat sinks 310 and the associated electronic components 302 (FIG. 3B) to be cooled. Flexible coolant supply conduits 410 and flexible coolant return conduits 411 are, in one embodiment, fabricated of a flexible, insulative material, such as rubber, and are of sufficient length to couple rigid coolant-cooled heat sinks 310 to pivotable coolant supply manifold 400 and pivotable coolant return manifold 401, via appropriate hose barb fittings and hose clamps. Note that the length of each coolant supply conduit 410 and coolant return conduit 411 is also sufficient to allow for pivotable movement of the rigid pivotable coolant supply manifold 400 and rigid pivotable coolant return manifold 401 between a first position, illustrated in FIG. 4, and a second service position, not illustrated. Note in this regard that the first and second pivot arms 420, 421 include respective base members 422, 423 which facilitate fastening of the first and second pivot arms to, for instance, a structure associated with the electronic system including the electronic components to be cooled. For instance, the first and second pivot arms 420, 421 could be affixed using mechanical fasteners 425 to the support substrate or main planar circuit board in the example of FIGS. 3A & 3B. Note also, in the example depicted in FIG. 4, first and second pivot arms 420, 421 align with the row of coolant-cooled heat sinks 310, and include a pivot axis 426 at upper ends of base members 422, 423, about which pivot elements 427 of the first and second pivot arms 420, 421, pivot. In the example depicted, the pivot axis 426 is at an elevated height above the row of coolant-cooled heat sinks 310, and pivotable coolant supply manifold 400 and pivotable coolant return manifold 401 are at an elevation higher than the coolant-cooled heat sinks when installed within the associated electronic system.

Flexibility is further achieved in the cooling assembly disclosed using flexible manifold-to-node fluid connect hoses 251, 261 to connect flexible coolant manifold-heat sink assembly 301 to, for instance, rack-level coolant supply and return manifolds, respectively (see FIGS. 2-3B). In one or more implementations, respective quick connect couplings 430, 431 at the ends of flexible manifold-to-node fluid connect hoses 251, 261, can be provided, and rigid tube extensions 438, 439 can respectively extend from pivotable coolant supply manifold 400 and pivotable coolant return manifold 401 and facilitate coupling of flexible manifold-to-node fluid connect hoses 251, 261 to the corresponding pivotable coolant supply and return manifolds using, for instance, respective hose barb fittings 434, 435 and hose clamps 436, 437. Note that, in one implementation, pivoting of pivotable coolant supply and return manifolds 400, 401 can be facilitated by providing flexible manifold-to-node fluid connect hoses 251, 261 with sufficient length to allow for transition of the pivotable coolant supply and return manifolds 400, 401 between their respective first and second positions, as described. Alternatively, the respective quick connect couplings 430, 431 with poppets can be disengaged from, for instance, the rack-level coolant supply and return manifolds (FIG. 2) prior to pivoting of the pivotable coolant supply and return manifolds 400, 401 from the illustrated first position to their second position.

By way of example, and as illustrated in FIGS. 3A & 4, pivotable coolant supply and return manifolds 400, 401 can be in a first position to, for instance, facilitate inclusion of the cooling assembly within the electronic system housing, drawer, chassis, etc., and operational insertion of the resultant cooled electronic system within the respective electronics rack. From this position, flexible coolant supply and return conduits 410, 411, and (in one or more embodiments) flexible manifold-to-node fluid connect hoses 251, 261 allow for pivoting of pivotable coolant supply and return manifolds 400, 401 to a second position, such as for servicing. Note that the in-line, six electronic component and six coolant-cooled heat sink example of FIGS. 3A-4 is provided as one example only of a coolant-based cooling system with coolant-cooled heat sinks. In general, the heat sinks referenced herein can be used in a wide variety of systems to facilitate cooling of one or more heat-generating components, such as one or more heat-generating electronic components of an electronic assembly, such as described herein, by way of example.

As noted, disclosed herein are computer-implemented methods, computer systems and computer program products for providing component positioning feedback within an electronic assembly, such as in one or more embodiments, an electronic assembly including a heat sink coupled to one or more heat-generating electronic components to be cooled. The heat sink can be a liquid-cooled heat sink, or an air-cooled heat sink. In one or more other embodiments, component positioning feedback such as disclosed herein can be provided in an electronic assembly without a heat sink. Many variations are possible. In one embodiment, the computer-implemented method includes obtaining component position data from a plurality of sensors of the electronic assembly at selected inspection points, where the component position data facilitates in situ evaluation of positioning of the component within the electronic assembly. Further, the method determines, via data analysis of the component position data, a current positioning of the component of the electronic assembly relative to another component of the electronic assembly, and generates a position feedback signal based on the determined current positioning of the component of the electronic assembly relative to the other component of the electronic assembly.

In one or more embodiments, the obtaining includes obtaining the component position data from the plurality of sensors of the electronic assembly at selected inspection points as part of inserting the component within the electronic assembly in operative position.

In one or more embodiments, the obtaining further includes obtaining component position change data from the plurality of sensors as part of positioning the component relative to a surface of the other component, where the determining and the generating include using the component position change data in determining the current positioning of the component relative to the surface of the other component, and in generating the position feedback signal based on the determining current positioning of the component of the electronic assembly relative to the surface of the other component of the electronic assembly.

In one or more implementations, the component position data includes position data indicative of whether there is an operative positioning of the component within the electronic assembly, and tilt data representative of a tilt angle of the component relative to the other component of the electronic assembly. In one embodiment, the component includes a heat sink and the other component includes an electronic circuit subassembly to be cooled, and the component position data includes position data indicative of an operative positioning of the heat sink relative to a subassembly circuit board of the electronic circuit subassembly, and tilt data representative of a tilt angle of the heat sink relative to the subassembly circuit board.

In one or more embodiments, the heat sink includes a rectangular-shaped heat sink surface, and the plurality of sensors include multiple sensors disposed at each corner of the rectangular-shaped heat sink surface. The determining includes obtaining average component position data for each corner of the rectangular-shaped heat sink, and comparing the average component position data for the different corners in ascertaining the position data indicative of whether there is an operative positioning of the heat sink, and the tilt data representative of the heat sink relative to the subassembly circuit board.

In one or more embodiments, the electronic circuit includes multiple integrated circuit die, and the heat sink couples to the multiple integrated circuit die via a thermal interface material.

In one or more embodiments, the component includes a heat sink of the electronic assembly, and the plurality of sensors include a plurality of multi-stage spring contact sensors disposed between the heat sink and a surface of the other component of the electronic assembly.

In one or more implementations, the component includes a heat sink of the electronic assembly, and the plurality of sensors include a plurality of Hall-effect sensors disposed between a surface of the heat sink and a surface of the other component of the electronic assembly.

In one or more implementations, the component includes a subassembly circuit board of the electronic assembly, and the other component of the electronic assembly comprises a main circuit board of the electronic assembly. The subassembly circuit board is coupled to the main circuit board via a land-grid array socket, and the plurality of sensors include a plurality of shorter pin-contact sensors that are shorter than the other, standard pin-contacts of the land-grid array socket.

In one or more implementations, computer-implemented methods, computer systems and computer program products are provided herein which provide in situ positioning feedback on a component within an electronic assembly relative to another component. The feedback allows for confirmation of proper positioning, as well as for measuring tilt angle of one component relative to another component, and thus in one embodiment, for confirming coplanarity of different components of the electronic assembly. By way of example, the components can include a heat sink, an electronic circuit subassembly, a socket, such as a land-grid array, a main circuit board (or main planar board), etc. The component positioning feedback disclosed includes position detection and measuring of distance between components and tilt angle between components, and can be implemented, in one or more embodiments, in situ during the manufacturing process, without disassembling the electronic assembly. Advantageously, structures and methods are disclosed herein to facilitate providing component positioning feedback by detecting, for instance, relative positioning of two components within the electronic assembly, such as the position of a heat sink over a main circuit board, and/or over a subassembly circuit board, as well as positioning of an electronic circuit subassembly relative to a main circuit board, or a connection socket between the two. In one or more implementations, a plurality of sensors are used to facilitate obtaining component position data on the distance between components of the assembly, such as between a heat sink and a main circuit board, the heat sink and an electronic circuit subassembly, and/or the electronic circuit subassembly and the main circuit board, via a socket array. Further, the component positioning feedback process facilitates determining a tilt angle between components, and thus, the relative coplanarity of selected components, such as coplanarity between the heat sink, electronic circuit subassembly, socket, main circuit board, etc., using different sets of sensors, such as disclosed herein.

Figure 5A:
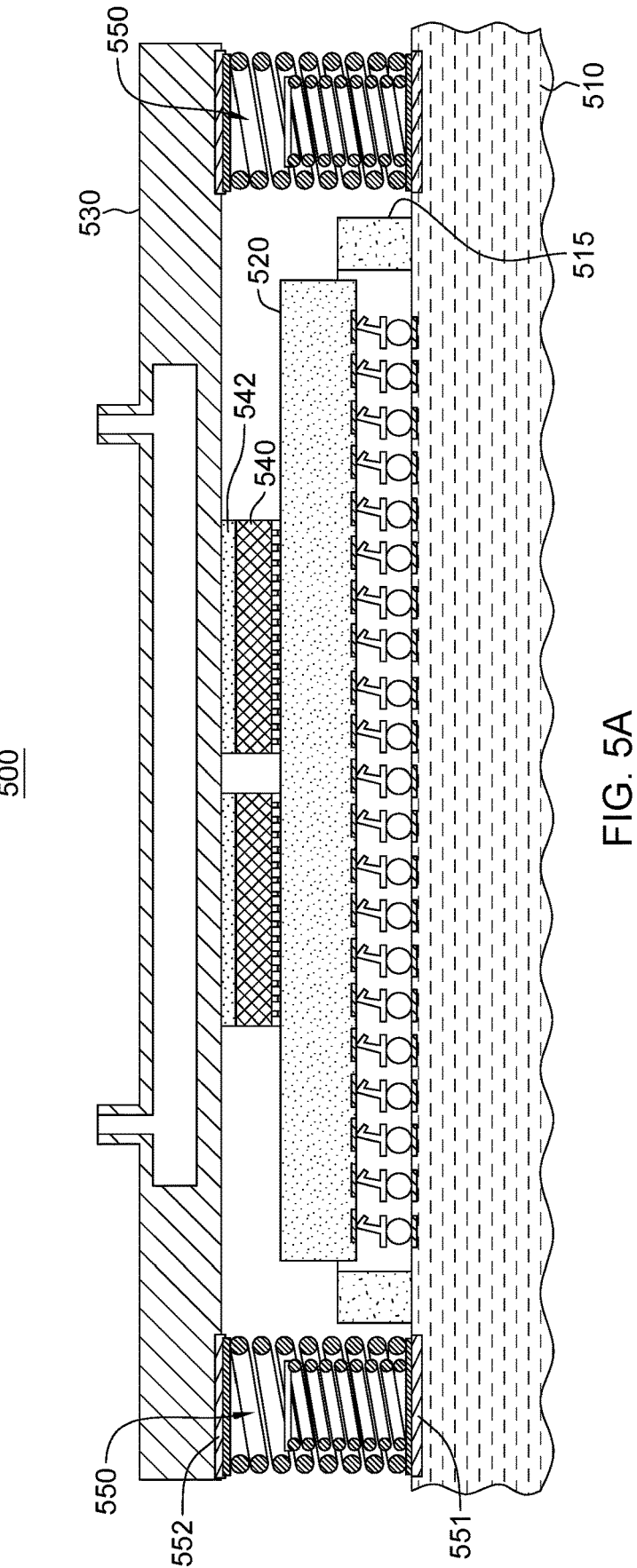
FIG. 5A is a cross-sectional elevational view of one embodiment of an electronic assembly with in situ component positioning feedback, in accordance with one or more aspects of the present disclosure.

By way of specific example, FIG. 5A depicts one embodiment of an electronic assembly 500, with a component positioning feedback facility in accordance with one or more aspects of the present disclosure. As illustrated in FIG. 5A, electronic assembly 500 includes a main circuit board 510, an electronic circuit subassembly (including a subassembly circuit board 520 and integrated circuit die 540) that is mounted to main circuit board 510 via a socket 515, such as a land-grid array socket. A heat sink 530 is coupled to integrated circuit die 540 via a thermal interface material 542. In the depicted embodiment, heat sink 530 is a coolant-cooled heat sink, such as coolant-cooled heat sink 310 described above in connection with FIGS. 2-4, by way of example only. In one or more other embodiments, heat sink 530 can be reconfigured as or replaced by, an air-cooled heat sink (not shown).

In one or more implementations, a plurality of sensors 550 are provided within electronic assembly 500 at selected inspection points to, for instance, facilitate in situ evaluation of positioning of a selected component relative to another component within the electronic assembly. In the embodiment of FIG. 5A, electronic assembly 500 includes sensors 550 at the periphery of heat sink 530, with the sensors being illustrated as compressible concentric spring-contact sensors, as one example. In one embodiment, the sensors can be attached to contact pads 551 on main planar circuit board 510, and align with contact pads 552 on heat sink 530 when the heat sink is operatively positioned within the assembly. A control or controller includes a detect circuit, or monitor circuit, electrically connected to contact pads 551 and 552 to evaluate electrical contact of sensors 550 to both contact pads 551, 552, and displacement of sensors 550 with positioning of heat sink 530 within the electronic assembly. By way of example, the detect circuit can include conductive lines connected to contact pads 551, 552 to measure, for instance, change in electrical resistance with applied deflection or strain of the deflected sensor. Regardless of the type of electrical contact sensor used, measurable change in electrical and/or electromagnetic properties will occur, and the changes can be amplified through a dedicated amplification circuit as needed in order to enable detection and measurement of the change. In one embodiment, the change in electrical and/or electromagnetic properties is characterized and correlated to a corresponding deflection height of the concentric spring-contact sensors, with the values of each sensor being compared to determine position and tilt of one component relative to another component. Depending on the sensed position of the sensors, the controller provides an appropriate position feedback signal to, for instance, facilitate operative positioning of the heat sink when being inserted into the electronic assembly and/or to monitor position of the heat sink (or other component) over the lifetime of the electronic assembly. In one or more embodiments, component positioning feedback can be provided periodically over the lifetime of the electronic assembly, and monitored remotely via a central server, in order to confirm continued proper positioning of selected components within the electronic assembly.

Figure 6B:
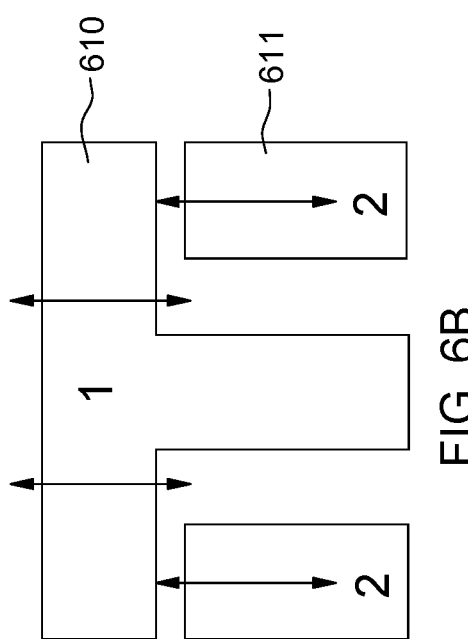
FIGS. 6A-6C are alternate embodiments of multi-stage spring contact sensors for use in electronic assemblies, such as depicted in FIGS. 5A-5C, to facilitate generating electronic component position data at inspection points for providing in situ component positioning feedback, in accordance with one or more aspects of the present disclosure.
Figure 6C:
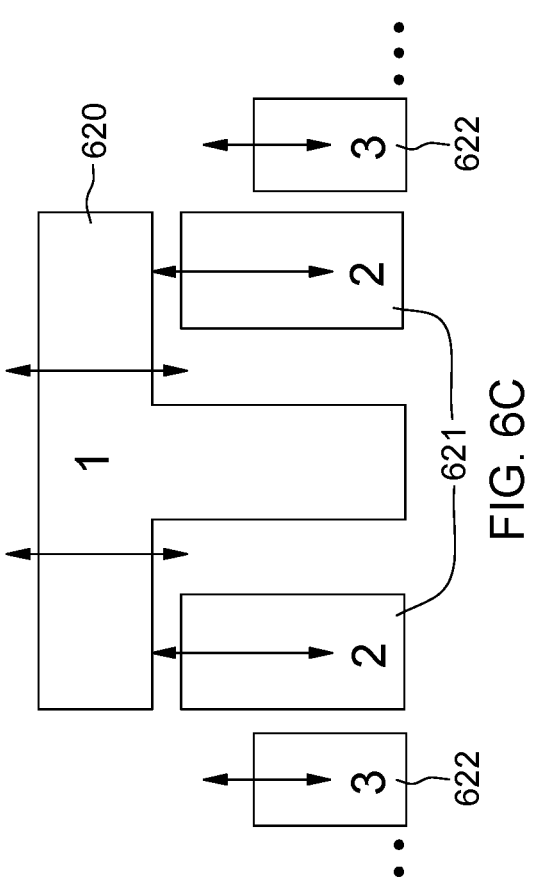
Figure 6A:
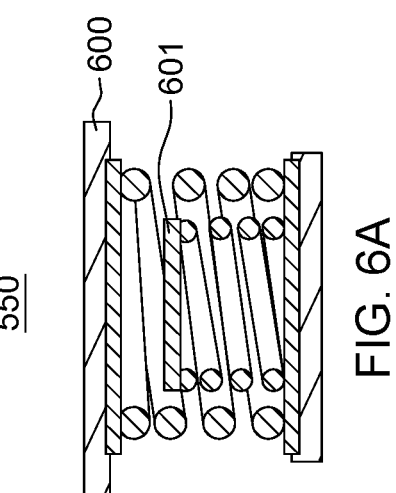

In one or more embodiments, sensors 550 are multi-contact sensors with multiple individual contact stages to, for instance, provide feedback which facilitates positioning of heat sink 530 relative to main planar circuit board 510 (that is, in the embodiment illustrated). For instance, each compressible concentric spring-contact forms a respective position sensor, and when contact is made with each respective contact stage, the detect circuit detects this and responds (in one embodiment) with an appropriate feedback signal. An example of this is depicted in FIGS. 6A-6C, where in FIG. 6A, sensor 550 is shown to include an outer compressible spring-contact 600 and an inner compressible spring-contact 601 located concentric with and disposed within outer compressible spring-contact 600. This two-stage sensor can be provided to detect relative distance between, for instance, heat sink 530 and main planar circuit board 510, in the example of FIG. 5A. The multi-stage sensing approach enables a "go, no-go" type detection or position feedback approach for each, which can aid in detecting when, for instance, the heat sink is positioned in each of its corners in a known good range for operation of the electronic assembly, such as when the inner compressible spring-contact 601 of each sensor 550 makes electrical contact with both contact pads of the components being evaluated.

By way of further example, FIGS. 6B-6C schematically depict a two-stage (i.e., stages 610, 611) and three-stage plus (e.g., stages 620, 621, 622) compressible contact sensor mechanisms, respectively, which can alternatively be used to generate component position data within an electronic assembly, such as disclosed herein. As each stage makes contact, a measurable change in electrical and/or electromagnetic properties through the respective detect circuit will occur, and the change can be evaluated by the controller as component position data.

In one or more implementations, the position sensors, such as depicted in FIGS. 6A-6C, are part of a respective detect circuit with, for instance, a controller being electrically connected to the respective detect circuits. In one or more embodiments, a detect circuit is complete when one or more of the spring-contact stages electrically connect the contact pads on the respective components. For instance, a first level of resistance within the detect circuit is detected when only the outer spring-contact of stage 1 electrically connects the contact pads, and a different level of resistance is detected when the inner spring-contact of stage 2 electrically connects with both contact pads. The process continues for any number of contact stages in order to achieve a desired measurement granularity.

Figure 5B:
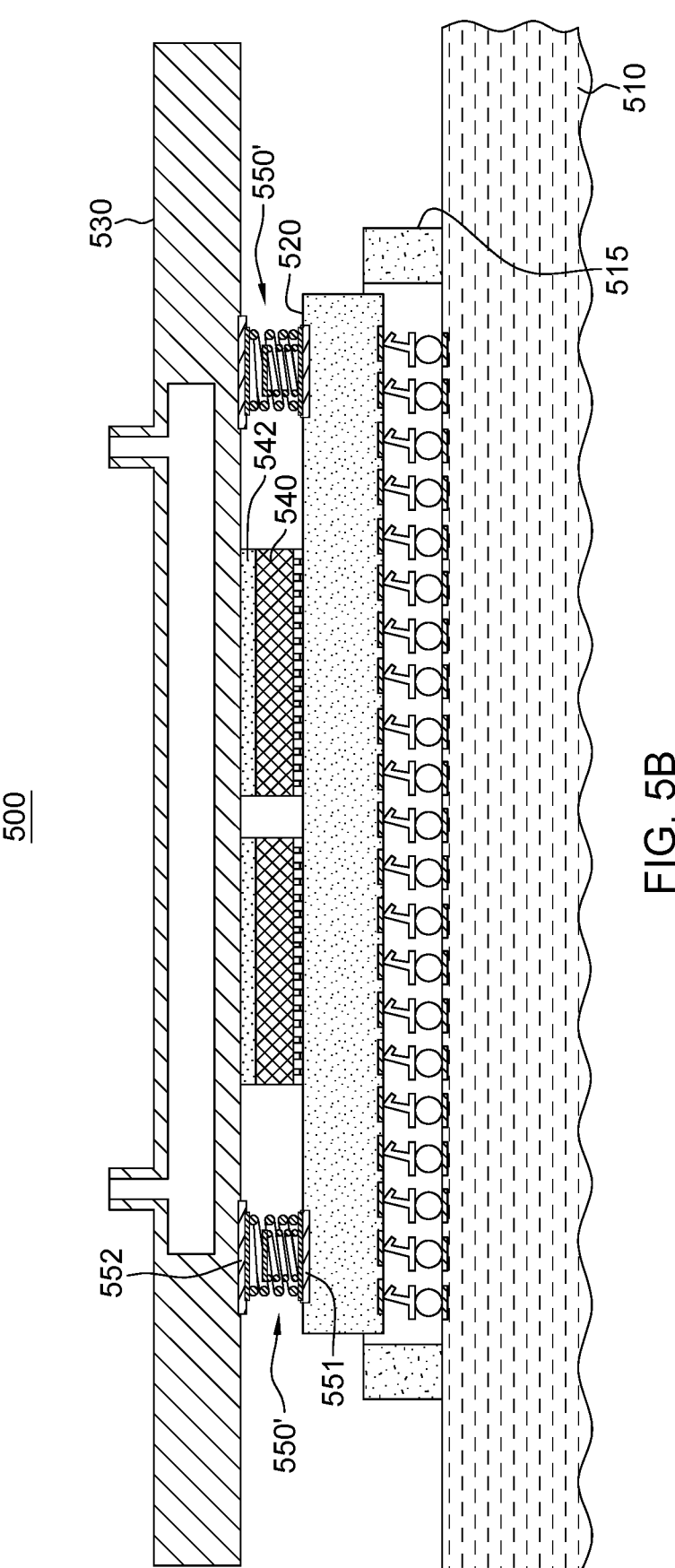
FIG. 5B is a cross-sectional elevational view of another embodiment of an electronic assembly with in situ component positioning feedback, in accordance with one or more aspects of the present disclosure.
Figure 5C:
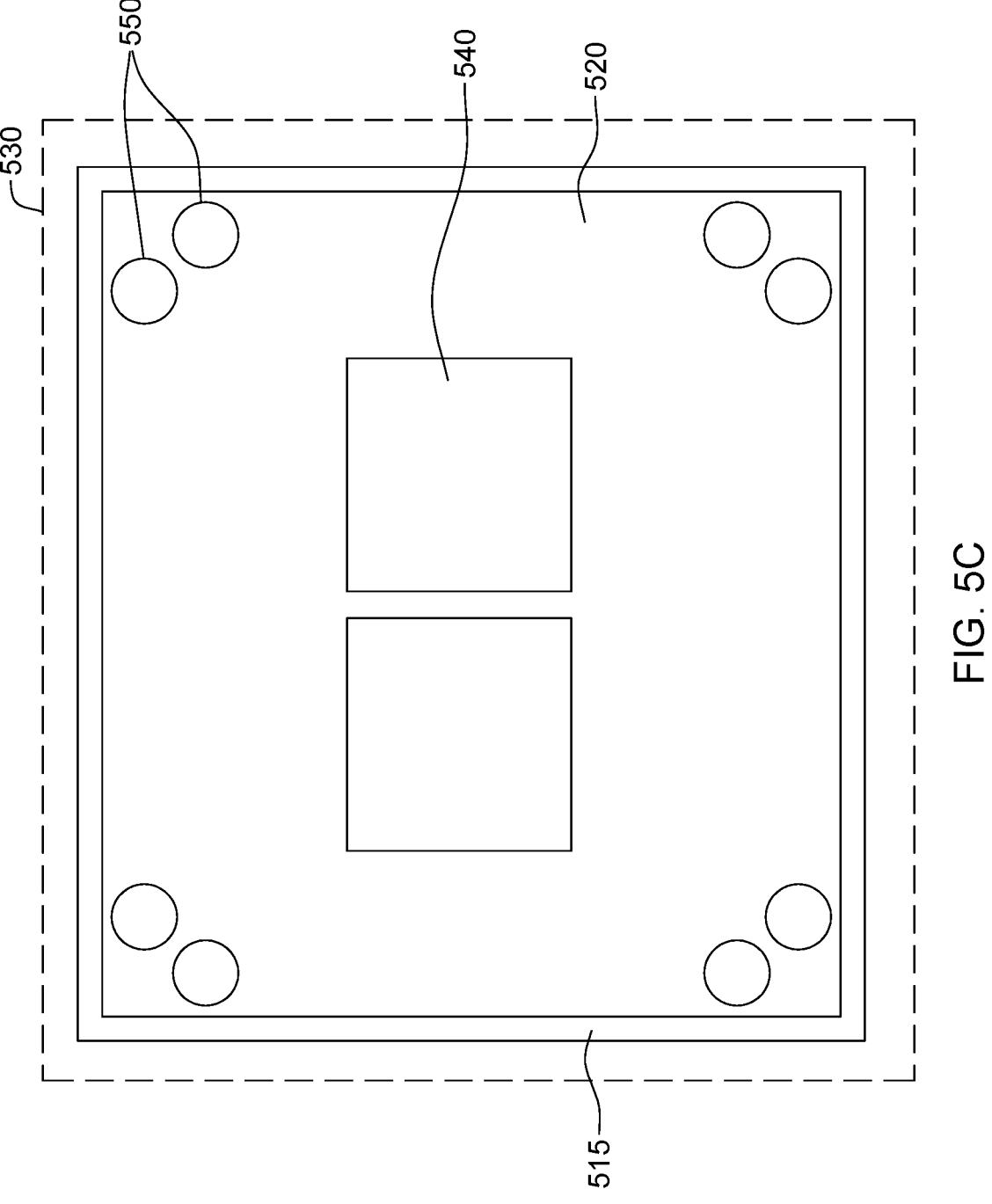
FIG. 5C is a partial plan view of the electronic assembly of FIG. 5B illustrating one embodiment of a plurality of sensors disposed at inspection points to facilitate in situ component positioning feedback, in accordance with one or more aspects of the present disclosure.

As another example, FIGS. 5B-5C depict electronic assembly 500 of FIG. 5A, but with the sensors 550' alternatively positioned between heat sink 530 and subassembly circuit board 520 to, for instance, measure position of the heat sink relative to the electronic circuit board directly, and/or to determine coplanarity between the respective heat sink surface and subassembly board surface. In this embodiment, sensors 550' are again illustrated as compressible concentric spring-contacts, by way of example, which can be solder-attached or otherwise securely attached to either subassembly circuit board 520 or to heat sink 530.

By way of example, FIG. 5C is a plan view of the electronic assembly of FIG. 5B, illustrating positioning of two or more sensors 550' at the corners of the subassembly circuit board 520 containing integrated circuit die 540. In one or more embodiments, the multiple sensors 550' disposed at each corner of the assembly facilitate checking detect circuit readings between sensors in the same corner to verify that the individual sensors are operating correctly. Further, in one or more implementations, readings from multiple sensors 550' in an individual corner can be averaged to obtain respective average measurement values for the corners, which can then be compared, for instance, to establish position and/or tilt data between one component and another component of the electronic assembly, such as between heat sink 530 and subassembly circuit board 520, in the example of FIGS. 5B-5C.

Those skilled in the art will note that sensors 550 in the embodiment of FIG. 5A can be similarly placed relative to, for instance, the corners of heat sink 530 in the case of a rectangular-shaped heat sink. Further, in one or more embodiments, different sets of sensors 550, 550' can be provided within a same electronic assembly to, for instance, monitor positioning of one or more components relative to one or more other components. In one embodiment, one set of sensors can facilitate measuring distance and tilt between one component, such as a heat sink, and another component, such as a main planar circuit board, and another set of sensors can measure distance and tilt between a further component, such as a subassembly circuit board, and the other component, such as the main planar circuit board. Many variations are possible, including the use of more than two sets of sensors and corresponding detect circuitry. In each instance, data-analysis-based in situ feedback of component positioning within the electronic assembly is provided.

In one or more embodiments, position and tilt detection can be performed via respective dedicated detection circuits which includes circuit lines, for instance, in the main planar circuit board and/or subassembly circuit board, as well as the compressible contacts, and an appropriate connection in, for instance, the electronic assembly lid, such as a heat-sink-type lid of the assembly. In one or more embodiments, multiple contacts are provided in each corner of the component and/or other component for which relative positioning is being determined. In one embodiment, two compressible spring-contacts are provided in each corner. Once the contacts make physical connection with the provided contact pads on the components, the detect circuit is closed, and a signal is sent to the controller or detect circuit that contact has been made. Once electrical contact is made, it is possible to measure changes in electrical properties of the spring-contacts with increasing strain. For instance, electrical resistance will vary with applied deflection or strain of the deflected contacts. In another embodiment, a wire coil's inductance will be proportional to its effective diameter, which increases with increasing compressive strain. Regardless of the shape of the spring-contact, measurable change in electrical and/or electromagnetic properties occurs with compression of the contact. These changes can be amplified through a dedicated amplification circuit of the detect circuit as needed to enable the detection and measurement of the change. The analysis is similar to operation of a strain gauge or a resistive or inductive force sensor. The change in electrical and/or electromagnetic properties can be characterized and correlated to the corresponding deflection height of the springs, and the values of each of these compared to determine position and tilt of the component relative to the other component. Additionally, a multi-level spring-contact structure such as disclosed enables contact detection and motion detection within known, good height ranges. The detected position of the contacts can be compared across the detect circuits for the different corners of the component.

The values can be compared to determine if, for instance, height and/or skew, tilt, or coplanarity, are within or outside of allowable ranges. A variety of different types of compression contacts can be used as position sensors in accordance with one or more aspects of the present disclosure. The embodiment of FIGS. 5A-6C are provided by way of example only.

Figure 7A:
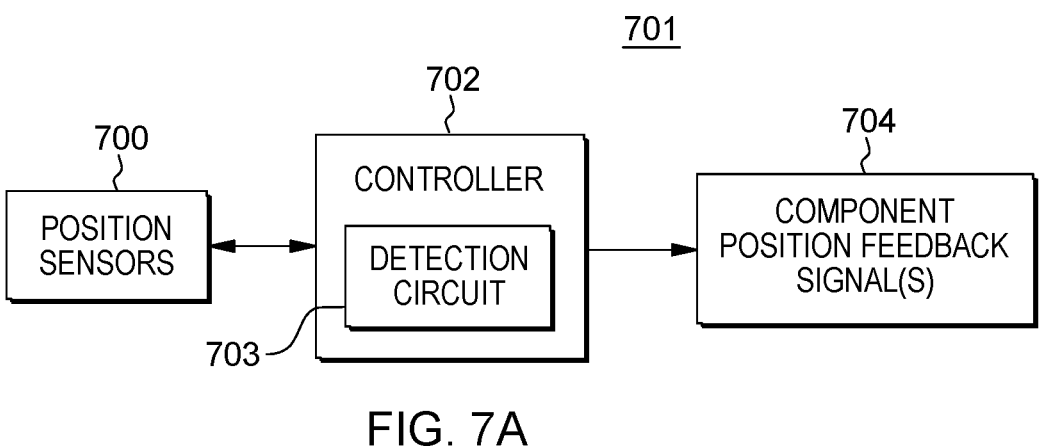
FIG. 7A depicts another embodiment of a computing environment to include and/or use one or more aspects of the present disclosure.

By way of example, FIG. 7A depicts another embodiment of a technical environment or system 701, into which various aspects of some embodiments of the present disclosure are implemented. In one embodiment, system 701 can be, or include, one or more systems 100 described above in connection with FIG. 1. In the depicted embodiment, system 701 includes a plurality of sensors 700, such as the sensors discussed herein, as well as a controller 702, with one or more detection circuits 703 and component position feedback 704, which can be via one or more indicators. In one or more embodiments, the controller or control system can be resident on the electronic assembly with the component positioning feedback, or one or more aspects can be implemented remote from the electronic assembly, such as at a central server monitoring performance of one or more electronic assemblies in a data center. In one or more embodiments, component positioning feedback signals 704 can be provided via respective indicators that can be, for instance, light-based indicators and/or audio-based indicators, by way of example. As noted, in one or more implementations, controller 702 ascertains, via the detection circuits, changes in electrical and/or electromagnetic properties of the contacts and correlates the changes to changes in position of one component of the electronic assembly relative to another component of the electronic assembly, such as described herein. For instance, in one or more embodiments, controller 702 includes a component positioning feedback module 200. Example embodiments of the component positioning feedback module and process are described below with reference to FIGS. 7B & 7C.

Figure 7B:
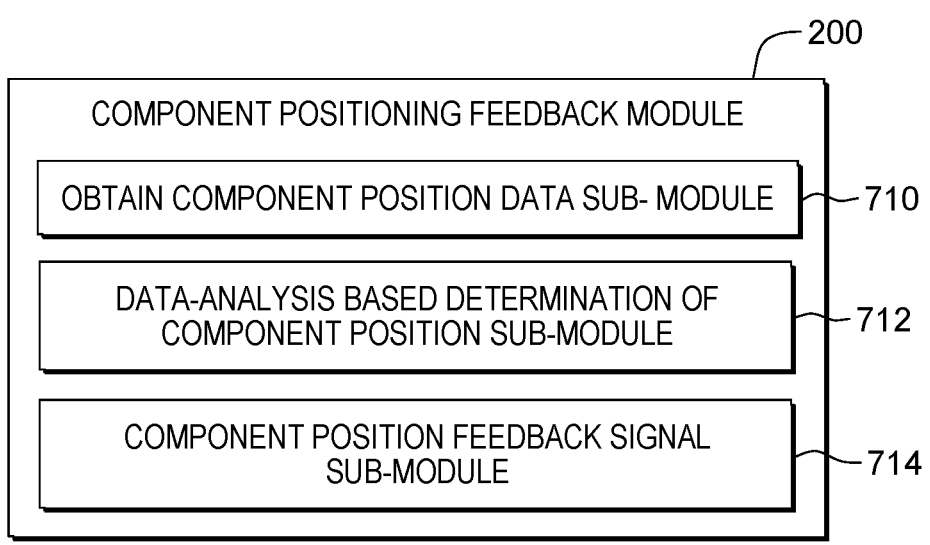
FIG. 7B depicts one embodiment of a computer program product with a component positioning feedback module, in accordance with one or more aspects of the present disclosure.
Figure 7C:
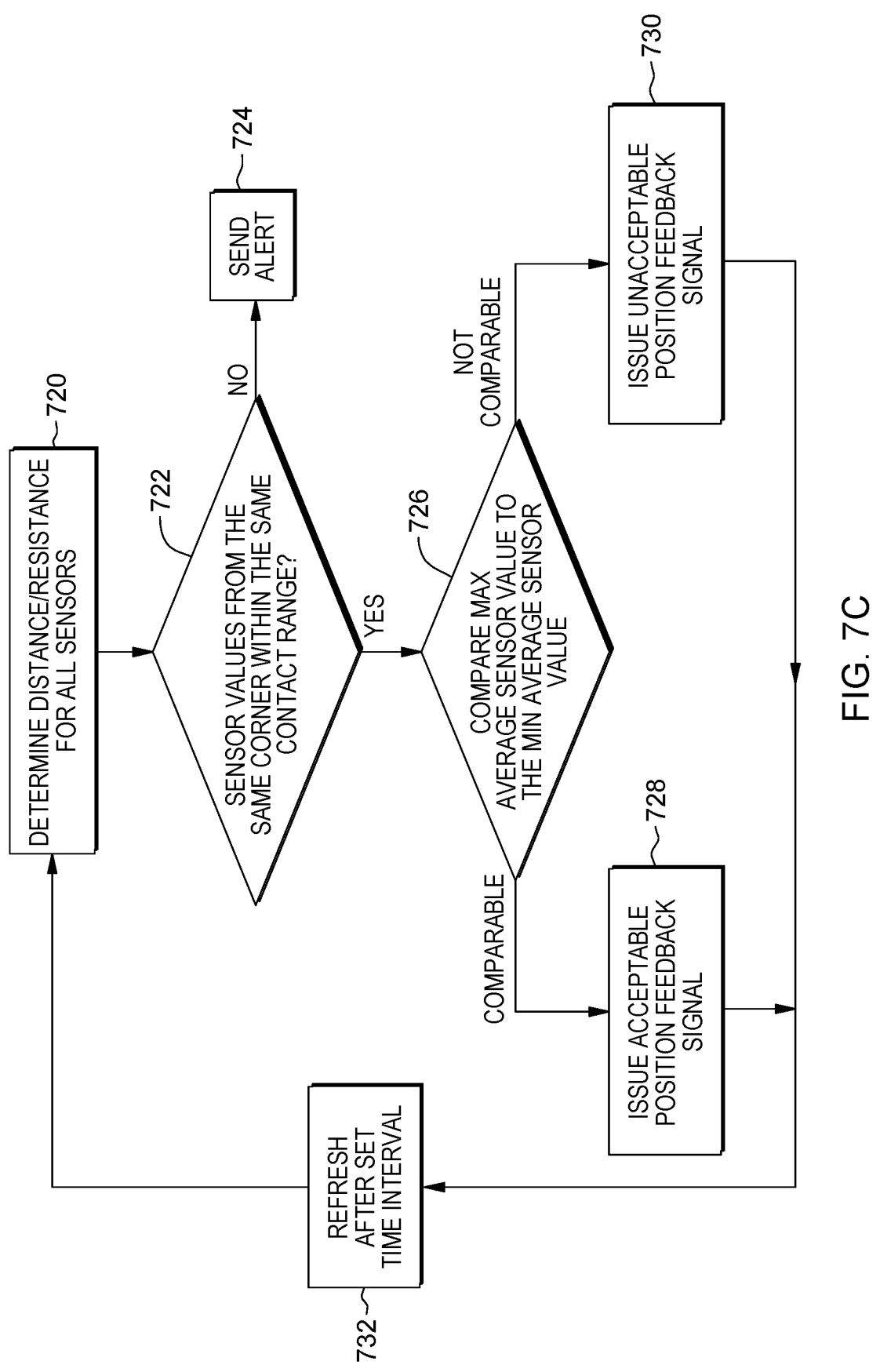
FIG. 7C depicts one embodiment of a component positioning feedback workflow, in accordance with one or more aspects of the present disclosure.

FIG. 7B depicts one embodiment of component positioning feedback module 200 that includes code or instructions to perform component positioning feedback processing, in accordance with one or more aspects of the present disclosure, and FIG. 7C depicts one embodiment of a component positioning feedback process, in accordance with one or more aspects of the present disclosure.

Referring to FIGS. 1 & 7B, component positioning feedback module 200 includes, in one example, various sub-modules used to perform processing, in accordance with one or more aspects of the present disclosure. The sub-modules are, e.g., computer-readable program code (e.g., instructions) and computer-readable media (e.g., persistent storage (e.g., persistent storage 113, such as a disk) and/or a cache (e.g., cache 121), as examples). The computer-readable media can be part of a computer program product and can be executed by and/or using one or more computers, such as computer(s) 101, processors, such as a processor of processor set 110, and/or processing circuitry, such as processing circuitry of processor set 110, etc.

In FIG. 7B embodiment, example sub-modules of component positioning feedback module 200 include, for instance, an obtain component position data sub-module 710 to obtain component position data from a plurality of sensors of the electronic assembly at selected inspection points, where the component position data facilitates in situ evaluation of positioning of the component within the electronic assembly. In addition, component positioning feedback module 200 includes a data-analysis-based determination of component position sub-module 712 to, for instance, deter-mine via data analysis of the component position data, a current positioning of the component of the electronic assembly relative to another component of the electronic assembly, and a component position feedback signal sub-module 714, which generates a position feedback signal based on the determined current positioning of the component of the electronic assembly relative to the other component of the electronic assembly.

Advantageously, the component positioning feedback module and process can extend component life within an electronic assembly by ensuring automated position feedback on component position and tilt within the electronic assembly, for instance, relative to another component of the electronic assembly. Advantageously, sensors (or position sensors) reside between multiple different components to facilitate determining position and tilt of, for instance, a heat sink, an electronic circuit subassembly, a circuit board socket, a main planar circuit board, etc., relative to each other. Position and tilt data can be ascertained for multiple component levels in an electronic assembly, including in a stack of different components. Positioning and tilt (or coplanarity) can be constantly monitored during an install process, and any misalignment can be instantly signaled if detected. A variety of types of different sensors can be used, depending on the implementation, either alone or in combination.

In one or more embodiments, the sub-modules of component positioning feedback module 200 are used, in accordance with one or more aspects of the present disclosure, to perform component position feedback processing. FIG. 7C depicts an example of a component positioning feedback process, where deflection, resistance, and/or electromagnetic changes are determined for the position sensors of the electronic assembly 720. In an implementation where multiple sensors are disposed at each corner of a component, processing determines whether the sensor values from a same corner are within the same contact range 722. If "no", then an alert is sent that there is a defective position sensor. The controller makes a data-analysis-based determination of component positioning. For instance, the controller compares a maximum average sensor value to a minimum average sensor value across the different corners of the component 726. If the values are comparable, for instance, indicative of a same and proper contact range, then an acceptable position feedback signal is issued 728 (e.g., via activation of one or more indicators associated with the electronic assembly or the electronic system, and/or by the sending of an electronic signal to a remote monitor). Alternatively, if the comparison indicates that the average sensor values between two or more corners are different, then a non-comparable determination is made, and an unacceptable position feedback signal is issued 730. Once the appropriate signal has been issued, the process can repeat or refresh after a set time interval 732, such as every second during installation of the component within the electronic assembly. As one example only, an acceptable position feedback signal could be activation of a green light indicator, and an unacceptable position feedback signal could be activation of a red light indicator.

Figure 8A:
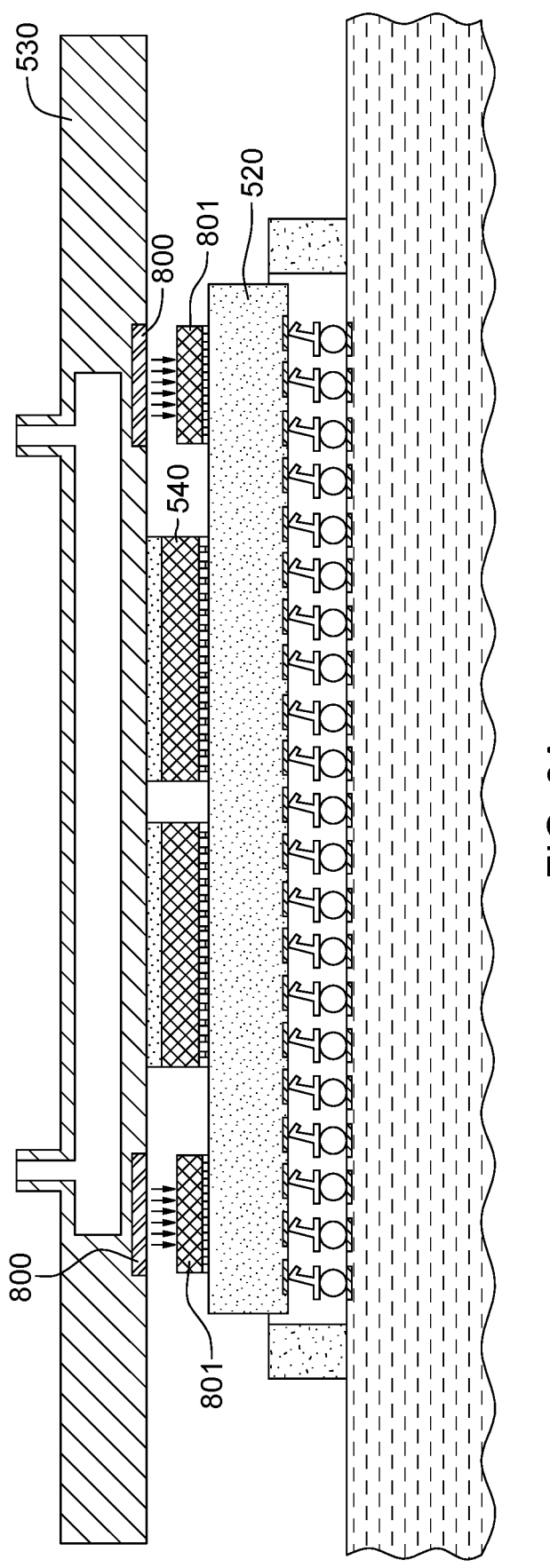
FIG. 8A is a cross-sectional elevational view of another embodiment of an electronic assembly with in situ component positioning feedback, in accordance with one or more aspects of the present disclosure.
Figure 8B:
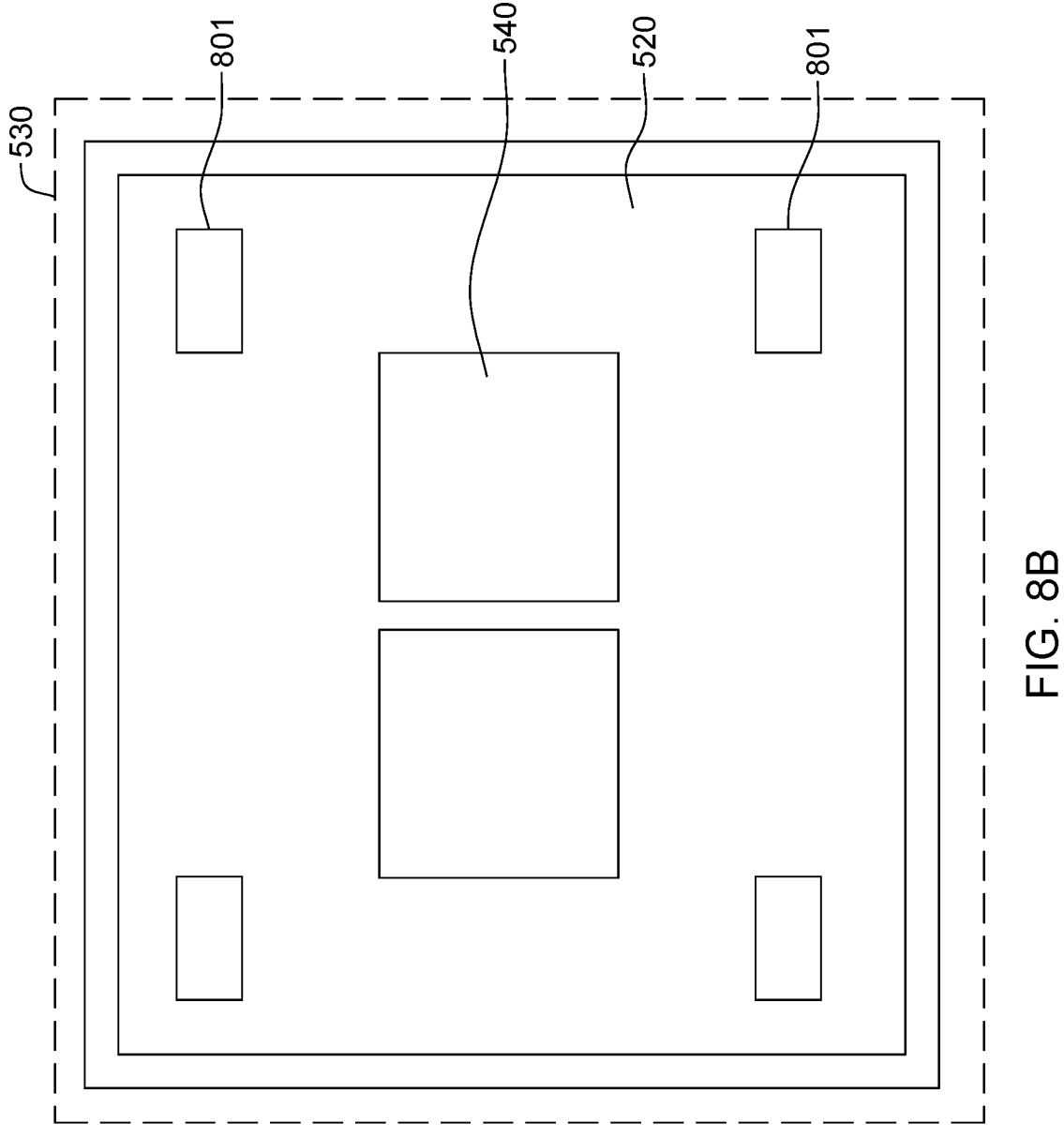
FIG. 8B is a partial plan view of the electronic assembly of FIG. 8A, illustrating one embodiment of a plurality of sensors disposed at inspection points to facilitate in situ component positioning feedback within the electronic assembly, in accordance with one or more aspects of the present disclosure.
Figure 8C:
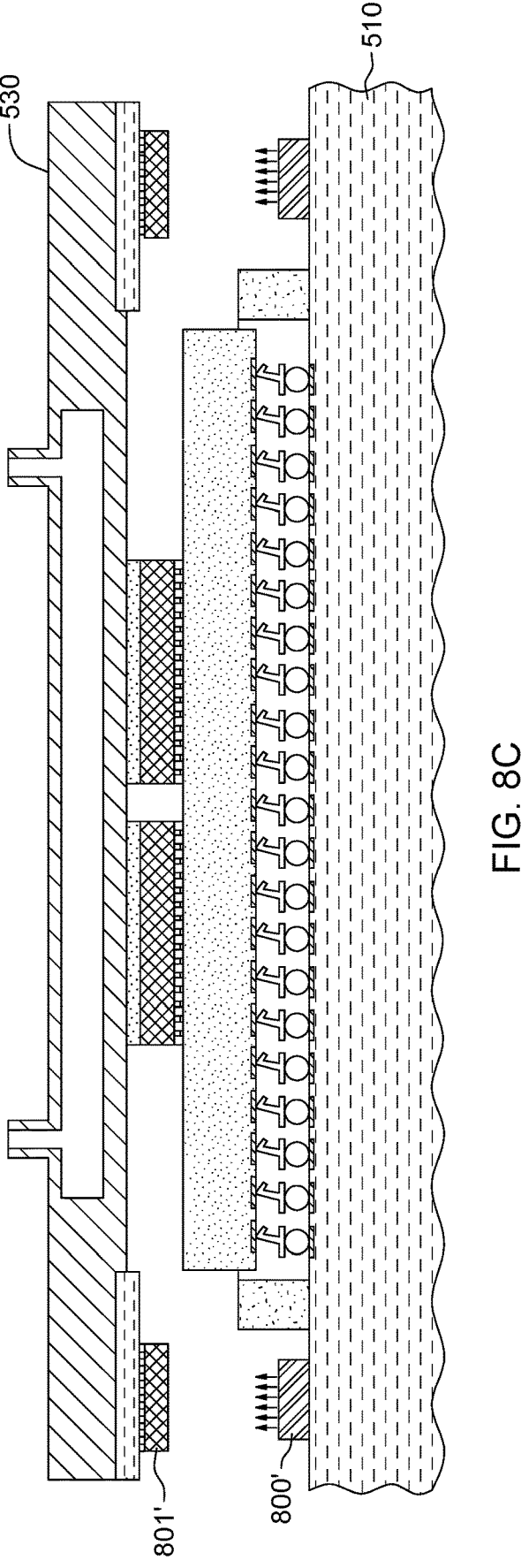
FIG. 8C is a cross-sectional elevational view of another embodiment of an electronic assembly with in situ component positioning feedback, in accordance with one or more aspects of the present disclosure.

FIGS. 8A-8C depict alternate embodiments of the electronic assembly of FIGS. 5A-5C, where the in situ component positioning feedback facility utilizes different sensor circuits, and in particular, Hall-effect sensor circuits, including a Hall-effect integrated circuit 801 a ferromagnetic (or electromagnetic) material 800. By way of example, a magnetic field orientation is illustrated in FIG. 8A with the ferromagnetic material 800 being coupled to or embedded within heat sink 530, and disposed to align over the Hall-effect integrated circuit 801 operatively positioned on electronic circuit subassembly 520. As illustrated in FIG. 8B, in one or more embodiments, the Hall-effect integrated circuits 801 can be positioned adjacent to or at the corners of either the one component (for instance, heat sink 530) or the other component (e.g., subassembly circuit board 520), similar to sensor placement in the embodiment of FIG. 5C.

In the embodiment of FIG. 8C, the sensors, which again include a Hall-effect integrated circuit 801' and a ferromagnetic material 800', are positioned to determine position and tilt (or coplanarity) of, for instance, heat sink 530 to main planar circuit board 510. In one embodiment, the sensors can be located near the corners of the heat sink (e.g., to facilitate determining tilt of the heat sink relative to main circuit board 510). By way of example, in this embodiment, the ferromagnetic material 800' is similar to ferromagnetic material 800 of the FIGS. 8A-8B implementation, but are associated with (e.g., secured to or embedded within) main planar circuit board 510, and Hall-effect integrated circuits 801' are similar to Hall-effect integrated circuits 801 of the embodiment of FIGS. 8A-8B, but are associated with (e.g., secured to or embedded within) heat sink 530.

In one or more embodiments, position and tilt detection can be performed by dedicated detect or monitor circuits which include circuit lines, for instance, on or in the subassembly circuit board 520, the Hall-effect integrated circuits 800 and the ferromagnetic (or electromagnetic) material associated with heat sink 530 (in one embodiment). The Hall-effect integrated circuits can be advantageously placed peripherally along or at the corners of one or more of the components being compared. The ferromagnetic (or electromagnetic) material can be placed in the other component so that the integrated circuits and the ferromagnetics are aligned as the one component is operatively positioned relative to the other component. In one embodiment, the Hall-effect integrated circuits can include a Hall-effect element, triggering amplification circuits, power regulation circuits, and other supporting circuitry, to enable communication with its associated detection and sensing circuits. The Hall-effect integrated circuits can be manufactured from semiconductor materials suitable for the application, such as GaAs, InAs, etc. As one component is brought into close proximity to the other component, the Hall-effect integrated circuits respond to the change in magnetic field caused by the relative motion of the ferromagnetic or electromagnetic material to the Hall-effect integrated circuit.

As noted, the Hall-effect integrated circuits and the ferromagnetics can be used in association with a variety of components of the electronics assembly, as desired for a particular application. For instance, multiple components in a stack-up of components of an electronic assembly can include respective Hall-effect position sensors, such as described herein. The Hall-effect integrated circuits can produce a trigger signal which can be detected by the controller as the component position data to detect the presence of one component relative to the other component. In one or more embodiments, the Hall-effect integrated circuit can also produce an output voltage, which changes proportionally with the change in magnetic flux, and therefore changes proportionally to the distance between the one component and the other component (i.e., between the Hall-effect integrated circuit and the ferromagnetic material). This change in voltage can be characterized and correlated to the corresponding distance or height between the two components, and the values of each of the sensor voltages can be compared to one another to determine both position and skew (i.e., tilt or coplanarity) of the one component relative to the other component. A variety of Hall-effect sensors are commercially available. For instance, commercially available Hall-effect sensors have a detection threshold on the order of 10 Gauss. Small form factor, commercially available Neodymium magnets may have a maximum field density on the order of approximately 10,000 Gauss.

Figure 9:
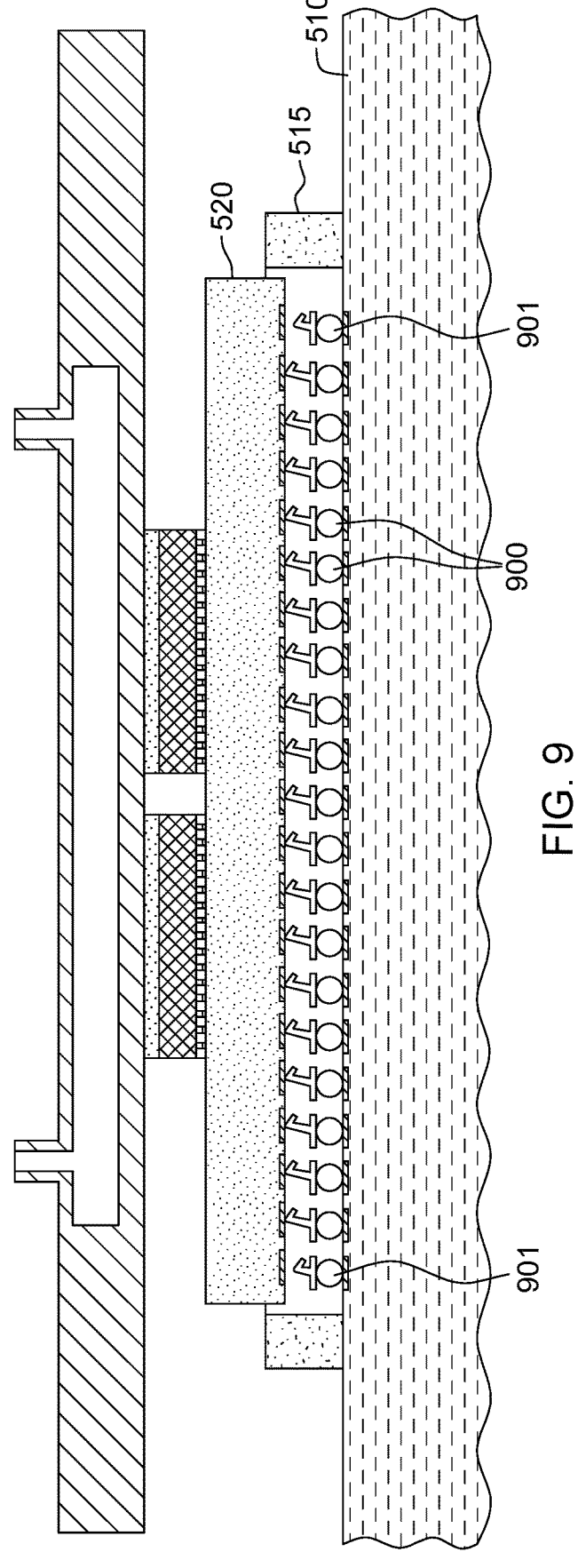
FIG. 9 is a cross-sectional elevational view of a further embodiment of an electronic assembly with in situ component positioning feedback, in accordance with one or more aspects of the present disclosure.

FIG. 9 depicts a further embodiment of an electronic assembly with in situ component positioning feedback, in accordance with one or more aspects of the present disclosure. FIG. 9 is an electronic assembly embodiment similar to the examples of FIGS. 5A-5C & 8A-8C. However, in this case, the component being evaluated is the subassembly circuit board 520 relative to the main planar circuit board 510. As noted, the subassembly circuit board 520 couples to the main circuit board 510 via a socket 515, such as a land-grid array socket, which includes a plurality of standard pin-contacts 900 of a substantially uniform height. In addition, socket 515 is revised to include shorter pin-contact sensors 901 near or at the corners of the socket. The shorter pin-contact sensors are shorter than the uniform pin contacts of the land-grid array socket and can be used to determine, for instance, if there is a tilt or other misalignment between the subassembly circuit board 520 (e.g., laminate board) and the main planar circuit board 510.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and Including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer-implemented method of providing component positioning feedback, the method comprising:

sensing, via a plurality of multi-position sensors, component position relative to a surface of an other component, the component and the other component being part of an electronic assembly, and the plurality of multi-position sensors being disposed at respective corners of the component, in between the component and the other component, and the sensing by the plurality of multi-position sensors generating component position data for the corners of the component relative to the surface of the other component at different component positions, wherein the component position data includes dynamic position-change data obtained during insertion of the component into operative position within the electronic assembly to facilitate dynamic evaluation of tilt and coplanarity of the component within the electronic assembly during the insertion of the component into operative position within the electronic assembly, and wherein at least one of the component and the other component comprises a circuit board of the electronic assembly;

determining, via data analysis of the component position data, a current positioning of the component of the electronic assembly relative to the surface of the other component of the electronic assembly; and generating a position feedback signal based on the determined current positioning of the component of the electronic assembly relative to the surface of other component of the electronic assembly to facilitate the dynamic evaluation of the tilt and coplanarity of the component within the electronic assembly.

2. The computer-implemented method of claim 1, wherein the sensing comprises sensing the component position relative to the surface of the other component at selected inspection points to obtain the component position data from the plurality of multi-position sensors of the electronic assembly at the selected inspection points as part of operatively inserting the component within the electronic assembly.

3. The computer-implemented method of claim 2, further comprising obtaining component position change data from the plurality of multi-position sensors as part of positioning the component relative to a surface of the other component, wherein the determining and the generating include using the component position change data in determining the current positioning of the component relative to the surface of the other component, and in generating the position feedback signal based on the determined current position of the component of the electronic assembly relative to the surface of the other component of the electronic assembly.

4. The computer-implemented method of claim 2, wherein the component position data comprises position data indicative of whether there is an operative positioning of the component within the electronic assembly, and tilt data representative of a tilt angle of the component relative to the other component of the electronic assembly.

5. The computer-implemented method of claim 4, wherein the component comprises a heat sink and the other component comprises an electronic circuit subassembly to be cooled, and wherein the component position data comprises position data indicative of an operative positioning of the heat sink relative to a subassembly circuit board of the electronic circuit subassembly, and tilt data representative of a tilt angle of the heat sink relative to the subassembly circuit board.

6. The computer-implemented method of claim 5, wherein the heat sink comprises a rectangular-shaped heat sink surface, and wherein the determining comprises obtaining average component position data for each corner of a plurality of corners of the rectangular-shaped heat sink surface, and comparing the average component position data for the plurality of corners in ascertaining the position data indicative of whether there is an operative positioning of the heat sink, and the tilt data representative of the tilt angle of the heat sink relative to the subassembly circuit board.

7. The computer-implemented method of claim 5, wherein the electronic circuit subassembly comprises multiple integrated circuit die, and the heat sink couples to the multiple integrated circuit die via a thermal interface material.

8. The computer-implemented method of claim 1, wherein the component comprises a heat sink of the electronic assembly and the plurality of multi-position sensors comprise a plurality of multi-stage spring contact sensors disposed between the heat sink and a surface of the other component of the electronic assembly.

9. The computer-implemented method of claim 1, wherein the component comprises a heat sink of the electronic assembly, and the plurality of multi-position sensors comprise a plurality of Hall-effect sensors disposed between a surface of the heat sink and a surface of the other component of the electronic assembly.

10. The computer-implemented method of claim 1, wherein the component comprises a subassembly circuit board of the electronic assembly, and the other component of the electronic assembly comprises a main circuit board of the electronic assembly, the subassembly circuit board being coupled to the main circuit board via a land-grid array socket, and wherein the plurality of multi-position sensors comprise a plurality of shorter pin-contact sensors that are shorter than other pin contacts of the land-grid array socket.

11. A computer system for providing component positioning feedback within an electronic assembly, the computer system comprising:

a memory; and at least one processor in communication with the memory, wherein the computer system is configured to perform a method, the method comprising:

sensing, via a plurality of multi-position sensors, component position relative to a surface of an other component, the component and the other component being part of an electronic assembly, and the plurality of multi-position sensors being disposed at respective corners of the component, in between the component and the other component, and the sensing by the plurality of multi-position sensors generating component position data for the corners of the component relative to the surface of the other component at different component positions, wherein the component position data includes dynamic position-change data obtained during insertion of the component into operative position within the electronic assembly to facilitate dynamic evaluation of tilt and coplanarity of the component within the electronic assembly during the insertion of the component into operative position within the electronic assembly, and wherein at least one of the component and the other component comprises a circuit board of the electronic assembly;

determining, via data analysis of the component position data, a current positioning of the component of the electronic assembly relative to the surface of the other component of the electronic assembly; and generating a position feedback signal based on the determined current positioning of the component of the electronic assembly relative to the surface of other component of the electronic assembly to facilitate the dynamic evaluation of the tilt and coplanarity of the component within the electronic assembly.

12. The computer system of claim 11, wherein the sensing comprises sensing the component position relative to the surface of the other component at selected inspection points to obtain the component position data from the plurality of multi-position sensors of the electronic assembly at the selected inspection points as part of operatively inserting the component within the electronic assembly.

13. The computer system of claim 12, wherein the obtaining further comprising obtaining component position change data from the plurality of multi-position sensors as part of positioning the component relative to a surface of the other component, wherein the determining and the generating include using the component position change data in determining the current positioning of the component relative to the surface of the other component, and in generating the position feedback signal based on the determined current position of the component of the electronic assembly relative to the surface of the other component of the electronic assembly.

14. The computer system of claim 12, wherein the component position data comprises position data indicative of whether there is an operative positioning of the component within the electronic assembly, and tilt data representative of a tilt angle of the component relative to the other component of the electronic assembly.

15. The computer system of claim 11, wherein the component comprises a heat sink of the electronic assembly, and the plurality of multi-position sensors comprise a plurality of multi-stage spring contact sensors disposed between the heat sink and a surface of the other component of the electronic assembly.

16. The computer system of claim 11, wherein the component comprises a heat sink of the electronic assembly, and the plurality of multi-position sensors comprise a plurality of Hall-effect sensors disposed between a surface of the heat sink and a surface of the other component of the electronic assembly.

17. The computer system of claim 11, wherein the component comprises a subassembly circuit board of the electronic assembly, and the other component of the electronic assembly comprises a main circuit board of the electronic assembly, the subassembly circuit board being coupled to the main circuit board via a land-grid array socket, and wherein the plurality of multi-position sensors comprise a plurality of shorter pin-contact sensors that are shorter than other pin contacts of the land-grid array socket.

18. A computer program product for providing component positioning feedback within an electronic assembly, the computer program product comprising:

one or more computer readable storage medium and program instructions embodied therewith, the program instructions being readable by a processing circuit to cause the processing circuit to:

sensing, via a plurality of multi-position sensors, component position relative to a surface of an other component, the component and the other component being part of an electronic assembly, and the plurality of multi-position sensors being disposed at respective corners of the component, in between the component and the other component, and the sensing by the plurality of multi-position sensors generating component position data for the corners of the component relative to the surface of the other component at different component positions, wherein the component position data includes dynamic position-change data obtained during insertion of the component into operative position within the electronic assembly to facilitate dynamic evaluation of tilt and coplanarity of the component within the electronic assembly during the insertion of the component into operative position within the electronic assembly, and wherein at least one of the component and the other component comprises a circuit board of the electronic assembly;

determining, via data analysis of the component position data, a current positioning of the component of the electronic assembly relative to the surface of the other component of the electronic assembly; and generating a position feedback signal based on the determined current positioning of the component of the electronic assembly relative to the surface of other component of the electronic assembly to facilitate the dynamic evaluation of the tilt and coplanarity of the component within the electronic assembly.

19. The computer program product of claim 18, wherein the program instructions readable by the processing circuit further cause the processing circuit to sense the component position relative to the surface of the other component at selected inspection points to obtain the component position data from the plurality of multi-position sensors of the electronic assembly at the selected inspection points as part of operatively inserting the component within the electronic assembly.

20. The computer program product of claim 19, wherein the component position data comprises position data indicative of whether there is an operative positioning of the component within the electronic assembly, and tilt data representative of a tilt angle of the component relative to the other component of the electronic assembly.

* * * * *